United States Patent
Ono et al.

(10) Patent No.: US 11,701,687 B2
(45) Date of Patent: Jul. 18, 2023

(54) DRIVE CIRCUIT, TRANSDUCER SYSTEM, AND INSPECTION DEVICE

(71) Applicant: KABUSHIKI KAISHA TOSHIBA, Tokyo (JP)

(72) Inventors: Tomio Ono, Yokohama Kanagawa (JP); Yutaka Nakai, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 323 days.

(21) Appl. No.: 17/178,658

(22) Filed: Feb. 18, 2021

(65) Prior Publication Data
US 2022/0062949 A1    Mar. 3, 2022

(30) Foreign Application Priority Data
Aug. 31, 2020    (JP) .................................. 2020-145890

(51) Int. Cl.
*B06B 1/06*    (2006.01)
*B06B 1/02*    (2006.01)
(Continued)

(52) U.S. Cl.
CPC .......... *B06B 1/0215* (2013.01); *B06B 1/0666* (2013.01); *H03H 7/06* (2013.01); *H10N 30/802* (2023.02); *H03H 2007/013* (2013.01)

(58) Field of Classification Search
CPC ... B06B 1/0215; B06B 1/0666; H01L 41/042; H10N 30/802
(Continued)

(56) References Cited

U.S. PATENT DOCUMENTS

2012/0280596 A1* 11/2012 Ide .......................... H02N 2/181
                                                              310/319
2013/0082566 A1*  4/2013 Tabata .................. H10N 30/306
                                                              310/317
(Continued)

FOREIGN PATENT DOCUMENTS

JP    2018-129755 A    8/2018
JP    2019-057804 A    4/2019

OTHER PUBLICATIONS

Uchino, "Piezoelectric Actuators and Ultrasonic Motors", The Kluwer International Series In: Electronic Materials: Science and Technology, 1996 (Deventer: Kluwer), 4 pages.

*Primary Examiner* — Derek J Rosenau
(74) *Attorney, Agent, or Firm* — Foley & Lardner LLP

(57) ABSTRACT

According to one embodiment, a drive circuit includes a first circuit part. The first circuit part includes a first detecting part, a second detecting part, a first circuit, and a second circuit. The first detecting part is configured to detect a first piezoelectric element current flowing in a first piezoelectric element, and output a first detection signal corresponding to the first piezoelectric element current. The second detecting part is configured to detect a first capacitance element current flowing in a first capacitance element, and output a second detection signal corresponding to the first capacitance element current. The first circuit includes a first input terminal and a second input terminal. The first circuit is configured to apply a first drive signal to the first piezoelectric element and the first capacitance element. The second circuit is configured to supply a first differential signal to the second input terminal.

17 Claims, 11 Drawing Sheets

(51) Int. Cl.
  *H03H 7/06* (2006.01)
  *H10N 30/80* (2023.01)
  *H03H 7/01* (2006.01)
(58) Field of Classification Search
  USPC .......................................................... 310/317
  See application file for complete search history.

(56) References Cited

U.S. PATENT DOCUMENTS

2018/0229267 A1  8/2018  Ono
2019/0088710 A1  3/2019  Itsumi

* cited by examiner

DRIVE CIRCUIT, TRANSDUCER SYSTEM, AND INSPECTION DEVICE

CROSS-REFERENCE TO RELATED APPLICATIONS

This application is based upon and claims the benefit of priority from Japanese Patent Application No. 2020-145890, filed on Aug. 31, 2020; the entire contents of which are incorporated herein by reference.

FIELD

Embodiments described herein relate generally to a drive circuit, a transducer system, and an inspection device.

BACKGROUND

For example, a transducer system that uses a piezoelectric element is applied to an inspection device or the like. A drive circuit is desirable in which operating characteristics can be improved.

DETAILED DESCRIPTION

Figure 1:
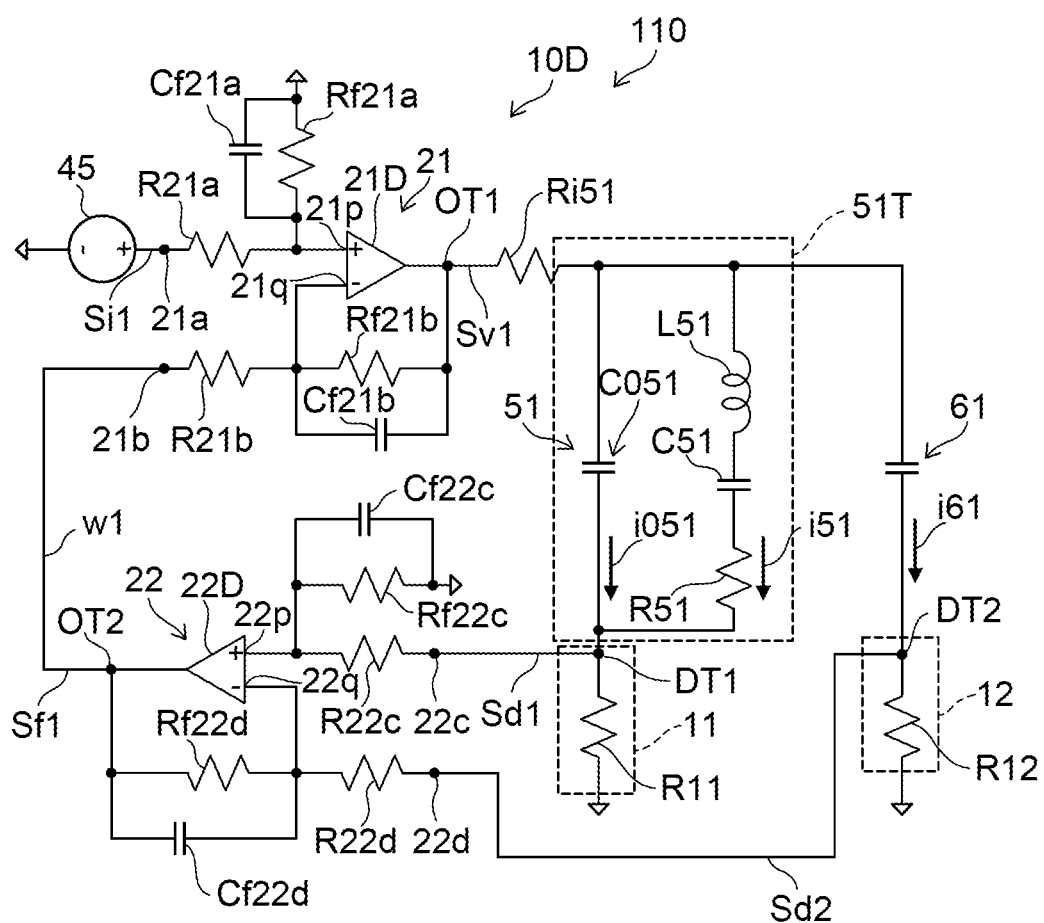
FIG. 1 is a circuit diagram illustrating a drive circuit according to a first embodiment.

According to one embodiment, a drive circuit includes a first circuit part. The first circuit part includes a first detecting part, a second detecting part, a first circuit, and a second circuit. The first detecting part is configured to detect a first piezoelectric element current flowing in a first piezoelectric element, and output a first detection signal corresponding to the first piezoelectric element current. The second detecting part is configured to detect a first capacitance element current flowing in a first capacitance element electrically connected with the first piezoelectric element, and output a second detection signal corresponding to the first capacitance element current. The first circuit includes a first input terminal and a second input terminal. An input signal is input to the first input terminal. The first circuit is configured to apply a first drive signal to the first piezoelectric element and the first capacitance element. The first drive signal corresponds to a potential difference between the first input terminal and the second input terminal. The second circuit includes a third input terminal and a fourth input terminal. The first detection signal is input to the third input terminal. The second detection signal is input to the fourth input terminal. The second circuit is configured to supply a first differential signal to the second input terminal. The first differential signal corresponds to a difference between the first detection signal and the second detection signal.

According to one embodiment, a drive circuit includes a first circuit part. The first circuit part includes a first detecting part, a second detecting part, a first circuit, and a second circuit. The first detecting part is configured to detect a first piezoelectric element current flowing in a first piezoelectric element, and output a first detection signal corresponding to the first piezoelectric element current. The second detecting part is configured to detect a first capacitance element current flowing in a first capacitance element electrically connected with the first piezoelectric element, and output a second detection signal corresponding to the first capacitance element current. The first circuit includes a first input terminal and a second input terminal. A potential of the first input terminal is fixed. The first circuit is configured to apply, to the first piezoelectric element and the first capacitance element, a first drive signal corresponding to a potential difference between the first input terminal and the second input terminal. The second circuit includes a third input terminal and a fourth input terminal. The first detection signal is input to the third input terminal. The second detection signal is input to the fourth input terminal. The second circuit is configured to supply, to the second input terminal, a first differential signal corresponding to a difference between the first detection signal and the second detection signal.

According to one embodiment, a transducer system includes the drive circuit described above, a first transducer including the first piezoelectric element, and a second transducer including the second piezoelectric element. The second transducer receives a sound wave transmitted from the first transducer. The third detection signal changes according to a state of an object between the first transducer and the second transducer.

According to one embodiment, an inspection device includes the transducer system described above. The inspection device inspects the object based on the third detection signal.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a circuit diagram illustrating a drive circuit according to a first embodiment.

Figure 2:
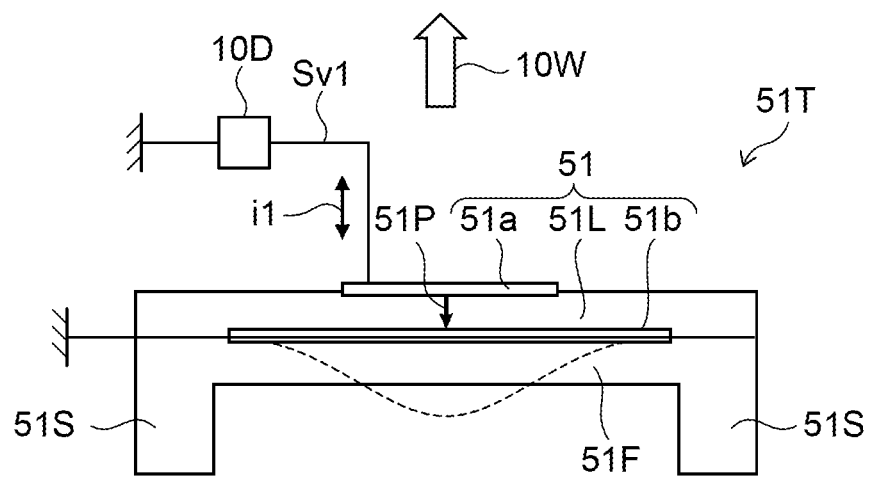
FIG. 2 is a schematic cross-sectional view illustrating a transducer used with the drive circuit according to the first embodiment.

FIG. 2 is a schematic cross-sectional view illustrating a transducer used with the drive circuit according to the first embodiment.

As shown in FIG. 1, the drive circuit 110 according to the embodiment includes a first circuit part 10D. The first circuit part 10D is used with a first piezoelectric element 51.

As shown in FIG. 2, for example, the first piezoelectric element 51 includes a first electrode 51a, a second electrode 51b, and a first piezoelectric layer 51L provided between the first electrode 51a and the second electrode 51b. For example, the first circuit part 10D is used with a first transducer 51T that includes the first piezoelectric element 51.

As shown in FIG. 1, the first transducer 51T can be electrically represented by an equivalent circuit that includes a capacitor C051 and an LCR circuit electrically connected in parallel with the capacitor C051. The LCR circuit includes an inductor L51, a capacitor C51, and a resistance R51 that are connected to each other in series. The capacitor C051 corresponds to the electrostatic capacitance between two electrodes of the first piezoelectric element 51. The inductor L51 corresponds to a mass that is a mechanical quantity of the first transducer 51T. The capacitor C51 corresponds to the reciprocal of a spring constant that is a mechanical quantity of the first transducer 51T. The resistance R51 corresponds to an attenuation constant that is a mechanical quantity of the first transducer 51T. The conversion from these mechanical quantities into electrical quantities is based on, for example, a piezoelectric effect of the first piezoelectric element 51.

One end of the capacitor C051 illustrated in FIG. 1 corresponds to one end of the first piezoelectric element 51 (one of the first electrode 51a or the second electrode 51b). The other end of the capacitor C051 corresponds to the other end of the first piezoelectric element 51 (the other of the first electrode 51a or the second electrode 51b).

As shown in FIG. 1, the first circuit part 10D includes a first detecting part 11, a second detecting part 12, a first circuit 21, and a second circuit 22.

As shown in FIG. 1, the first detecting part 11 is configured to detect a first piezoelectric element current i1 flowing in the first piezoelectric element 51 (referring to FIG. 2) and to output a first detection signal Sd1 corresponding to the first piezoelectric element current i1. The first piezoelectric element current i1 is the sum of a current i051 and a current i51 illustrated in FIG. 1. The current i051 is the current that flows in the capacitor C051. The current i51 flows in the LCR circuit. The first detection signal Sd1 corresponds to the first piezoelectric element current i1 (the sum of the current i051 and the current i51).

For example, the first detecting part 11 includes a first detection terminal DT1. The first detection terminal DT1 outputs the first detection signal Sd1 corresponding to the detected first piezoelectric element current i1. In the example, the first detecting part 11 includes a resistance R11. For example, one end of the resistance R11 is electrically connected with one end of the first piezoelectric element 51 (one end of the capacitor C051). The other end of the resistance R11 is set to a fixed potential (e.g., a ground potential). The one end of the resistance R11 corresponds to the first detection terminal DT1.

A first capacitance element 61 is provided as shown in FIG. 1. The first capacitance element 61 may be included in the first circuit part 10D. The first capacitance element 61 may be provided separately from the first circuit part 10D. The first capacitance element 61 may be included in the first transducer 51T. The first capacitance element 61 may be provided separately from the first circuit part 10D and the first transducer 51T.

As shown in FIG. 1, the first capacitance element 61 is electrically connected with the first piezoelectric element 51. For example, the first capacitance element 61 is electrically connected in parallel with the first piezoelectric element 51. One end of the first capacitance element 61 is electrically connected with the one end of the first piezoelectric element 51 (one of the first electrode 51a or the second electrode 51b). The other end of the first capacitance element 61 is electrically connected with the other end of the first piezoelectric element 51 (the other of the first electrode 51a or the second electrode 51b).

The second detecting part 12 is configured to detect a first capacitance element current i61 flowing in the first capacitance element 61 and to output a second detection signal Sd2 corresponding to the first capacitance element current i61. The second detecting part 12 includes a second detection terminal DT2. The second detection terminal DT2 outputs the second detection signal Sd2 corresponding to the detected first capacitance element current i61. In the example, the second detecting part 12 includes a resistance R12. For example, one end of the resistance R12 is electrically connected with the one end of the first capacitance element 61. The other end of the resistance R12 is set to a fixed potential (e.g., the ground potential). The one end of the resistance R12 corresponds to the second detection terminal DT2.

The first circuit 21 includes a first input terminal 21a and a second input terminal 21b. An input signal Si1 is input to the first input terminal 21a. For example, the input signal Si1 is output from an input signal supplier 45. The input signal supplier 45 may be included in the drive circuit 110 (or the first circuit part 10D). The input signal supplier 45 may be provided separately from the drive circuit 110 (or the first circuit part 10D). The input signal Si1 may include, for example, a pulse signal or a burst signal.

The first circuit 21 is configured to apply, to the first piezoelectric element 51 and the first capacitance element 61, a first drive signal Sv1 that corresponds to the potential difference between the first input terminal 21a and the second input terminal 21b. The first circuit 21 is, for example, a differential amplifier circuit. The first circuit 21 includes, for example, a first output terminal OT1. The first output terminal OT1 is configured to output the first drive signal Sv1. The first output terminal OT1 is electrically connected with the other end of the first piezoelectric element 51 and the other end of the first capacitance element 61. A resistance Ri51 may be provided between the first output terminal OT1 and the other end of the first piezoelectric element 51.

For example, the first circuit 21 is configured to drive the first piezoelectric element 51 and the first capacitance element 61 according to the input signal Si1. For example, the first piezoelectric element 51 is deformed by the first drive signal Sv1 applied to the first piezoelectric element 51; and a sound wave (e.g., including an ultrasonic wave) is emitted according to the deformation. The input signal Si1 is, for example, a control signal of the generation of the sound wave.

In the first circuit 21 of the example, the first input terminal 21a is a positive input terminal; and the second input terminal 21b is a negative input terminal. In the example, the first circuit 21 includes a differential amplifier 21D, a resistance R21a, a resistance R21b, a resistance Rf21a, a capacitor Cf21a, a resistance Rf21b, and a capacitor Cf21b. The resistance R21a is located in a current path between the first input terminal 21a and an input part 21p of the differential amplifier 21D. The resistance R21b is located in a current path between the second input terminal 21b and an input part 21q of the differential amplifier 21D. The capacitor Cf21a is electrically connected in parallel with the resistance Rf21b. One end of the capacitor Cf21a and one end of the resistance Rf21a are electrically connected with the input part 21p of the differential amplifier 21D. The other ends of the capacitor Cf21a and the resistance Rf21a are electrically connected to a fixed potential (e.g., the ground potential). The capacitor Cf21b is electrically connected in parallel with the resistance Rf21b. One end of the capacitor Cf21b and one end of the resistance Rf21b are electrically connected with the input part 21q of the differential amplifier 21D. The other ends of the capacitor Cf21b and the resistance Rf21b are electrically connected with the outputter (the first output terminal OT1) of the differential amplifier 21D. The resistances are selected to obtain the appropriate amplification factor. For example, a positive power supply and a negative power supply are supplied to the differential amplifier 21D.

The second circuit 22 includes a third input terminal 22c and a fourth input terminal 22d. The first detection signal Sd1 is input to the third input terminal 22c. The second detection signal Sd2 is input to the fourth input terminal 22d.

The second circuit 22 is configured to supply, to the second input terminal 21b, a first differential signal Sf1 that corresponds to the difference between the first detection signal Sd1 and the second detection signal Sd2. The second circuit 22 is, for example, a differential amplifier circuit. For example, the second circuit 22 includes a second output terminal OT2. The second output terminal OT2 is configured to output the first differential signal Sf1. In the example, the second output terminal OT2 is electrically connected with the second input terminal 21b by wiring w1. As described below, an electrical circuit such as a filter, etc., may be provided in a current path (e.g., the wiring w1) between the second output terminal OT2 and the second input terminal 21b.

In the second circuit 22 of the example, the third input terminal 22c is a positive input terminal; and the fourth input terminal 22d is a negative input terminal. In the example, the second circuit 22 includes a differential amplifier 22D, a resistance R22c, a resistance R22d, a resistance Rf22c, a capacitor Cf22c, a resistance Rf22d, and a capacitor Cf22d. The resistance R22c is located in a current path between the third input terminal 22c and an input part 22p of the differential amplifier 22D. The resistance R22d is located in a current path between the fourth input terminal 22d and an input part 22q of the differential amplifier 22D. The capacitor Cf22c is electrically connected in parallel with the resistance Rf22c. One end of the capacitor Cf22c and one end of the resistance Rf22c are electrically connected with the input part 22p of the differential amplifier 22D. The other ends of the capacitor Cf22c and the resistance Rf22c are electrically connected to a fixed potential (e.g., the ground potential). The capacitor Cf22d is electrically connected in parallel with the resistance Rf22d. One end of the capacitor Cf22d and one end of the resistance Rf22d are electrically connected with the input part 22q of the differential amplifier 22D. The other ends of the capacitor Cf22d and the resistance Rf22d are electrically connected with the outputter (the second output terminal OT2) of the differential amplifier 22D. The resistances are selected to obtain the appropriate amplification factor. For example, a positive power supply and a negative power supply are supplied to the differential amplifier 22D.

According to the embodiment, the first differential signal Sf1 that corresponds to the difference between the current flowing in the first piezoelectric element 51 and the current flowing in the first capacitance element 61 is supplied to the second input terminal 21b of the first circuit 21. For example, the first differential signal Sf1 is fed back. The first drive signal Sv1 that is output from the first circuit 21 corresponds to the difference between the input signal Si1 and the first differential signal Sf1. The operating characteristics of the first piezoelectric element 51 can be improved by such a drive circuit.

As shown in FIG. 2, the first transducer 51T may include the first piezoelectric element 51 and a first diaphragm 51F (e.g., a membrane portion). The first piezoelectric element 51 is fixed to the first diaphragm 51F. For example, the first piezoelectric element 51 is stacked with the first diaphragm 51F. The first transducer 51T is, for example, a bending vibration-type transducer. Examples of the first piezoelectric element 51 and the first transducer 51T are described below. An example of when the first transducer 51T includes the first piezoelectric element 51 and the first diaphragm 51F will now be described.

Figure 3A:
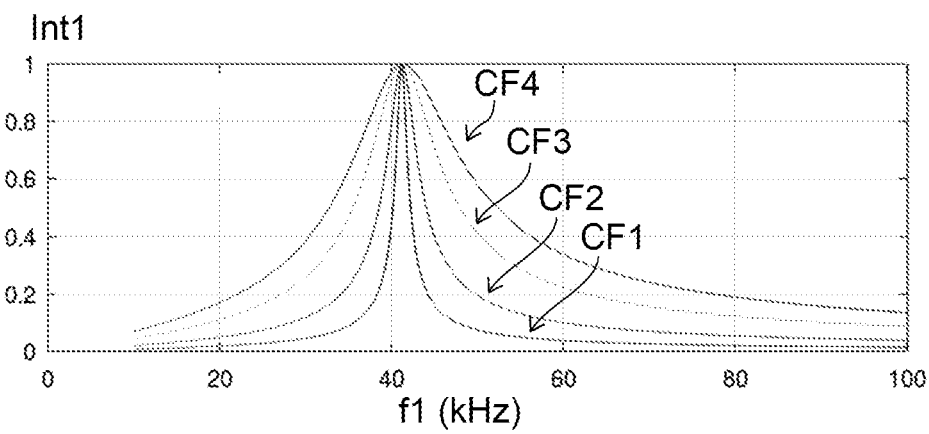
FIGS. 3A and 3B are graphs illustrating characteristics of the drive circuit.
Figure 3B:
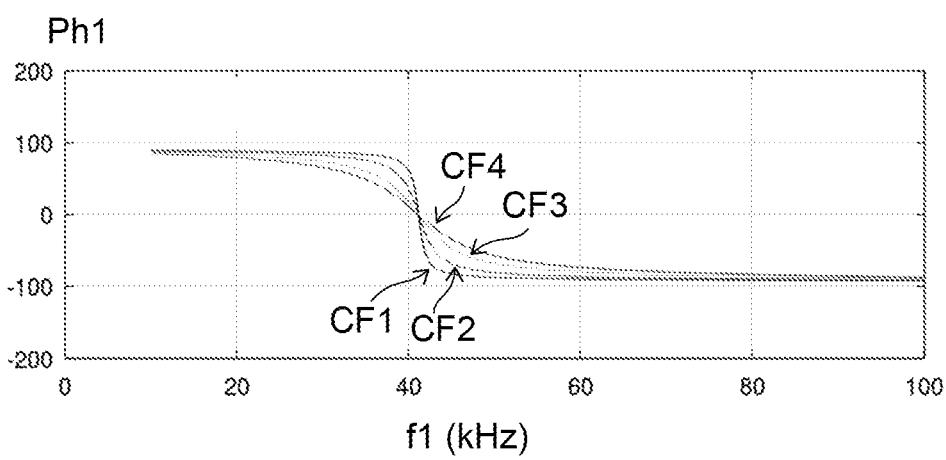

FIGS. 3A and 3B are graphs illustrating characteristics of the drive circuit.

These figures illustrate simulation results of the first differential signal Sf1 when parameters of the drive circuit are changed. In FIGS. 3A and 3B, the horizontal axis corresponds to a frequency f1. The vertical axis of FIG. 3A corresponds to a normalized intensity Int1 of the first differential signal Sf1. The vertical axis of FIG. 3B corresponds to a phase Ph1 of the first differential signal Sf1.

In the simulation, the electrical capacitance (the capacitor C051) of the first piezoelectric element 51 is 1.76 nF, the inductor L51 is 48.1 mH, the electrical capacitance of the capacitor C51 is 0.319 nF, and the resistance R51 is 274Ω. The electrical capacitance of the first capacitance element 61 is 2 nF. The resistance R11 is 10Ω. The resistance R12 is 10Ω. The resistance Ri51 is 0Ω. The resistances R21a, R21b, R22c, and R22d are 10 kΩ. The resistances Rf22c and Rf22d are 100 kΩ. The electrical capacitances of the capacitors Cf21a, C21b, Cf22c, and Cf22d are 0 pF.

FIGS. 3A and 3B illustrate the characteristics of Configurations CF1 to CF4. In the Configuration CF1, the first differential signal Sf1 is not supplied to the second input terminal 21b. In such a case, the second input terminal 21b is grounded. In the Configurations CF2 to CF4, the first differential signal Sf1 is supplied to the second input terminal 21b. In the Configuration CF2, the resistances Rf21a and Rf21b are 100 kΩ. In the Configuration CF3, the resistances Rf21a and Rf21b are 300 kΩ. In the Configuration CF4, the resistances Rf21a and R21fb are 500 kΩ.

As shown in FIGS. 3A and 3B, the bandwidth of the Configuration CF1 is narrow. The bandwidth is wide for the Configurations CF2 to CF4. According to the embodiment, wide-bandwidth characteristics are obtained. The bandwidth is widened by increasing the feedback gain by increasing the resistances Rf21a and Rf21b.

Figure 4:
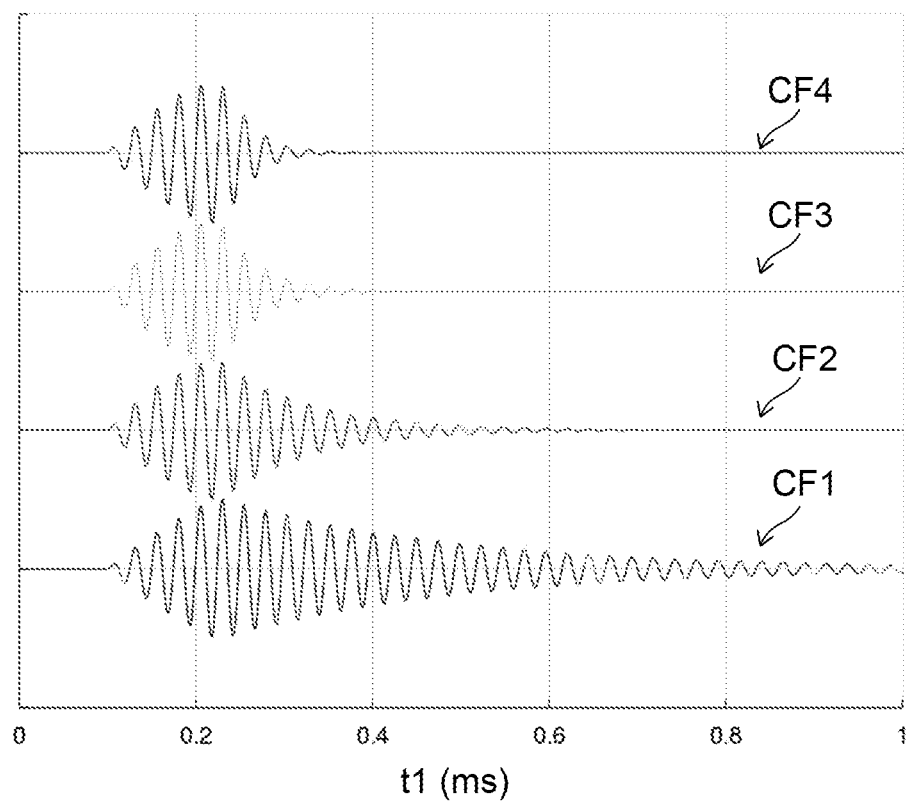
FIG. 4 is a graph illustrating characteristics of the drive circuit.

FIG. 4 is a graph illustrating characteristics of the drive circuit.

FIG. 4 illustrates simulation results of the first differential signal Sf1 when parameters of the drive circuit are changed. In FIG. 4, the input signal Si1 is a burst wave that includes five sine waves. The horizontal axis of FIG. 4 corresponds to a time t1. The vertical axis of FIG. 4 corresponds to the normalized intensity Int1 of the first differential signal Sf1. The configurations of the models of the simulation of FIG. 4 are similar to the configurations described in reference to FIGS. 3A and 3B.

For the Configuration CF1 as shown in FIG. 4, the time until the normalized intensity Int1 becomes small is extremely long. For the Configurations CF2 to CF4, the time until the normalized intensity Int1 becomes small is short. Thus, according to the embodiment, a short pulse length is obtained. A shorter pulse length is obtained by increasing the resistances Rf21a and R21fb.

Thus, according to the embodiment, for example, wide-bandwidth characteristics are obtained. For example, the first transducer 51T can be driven by a short pulse width. According to the embodiment, a drive circuit can be provided in which the operating characteristics of the transducer can be improved.

According to the embodiment, the first circuit part 10D can emit the ultrasonic wave from the first transducer 51T including the first piezoelectric element 51. According to the embodiment, for example, an ultrasonic wave that has a short pulse length can be generated. For example, a wide-bandwidth ultrasonic wave can be generated. For example, the first circuit part 10D according to the embodiment is useful in a bending vibration-type air-coupled ultrasonic transducer having a narrow bandwidth.

According to the embodiment, for example, the electrical capacitance of the first capacitance element 61 may be set according to the electrical capacitance of the first piezoelectric element 51. For example, the electrical capacitance of the first capacitance element 61 is substantially equal to the electrical capacitance of the first piezoelectric element 51. For example, the electrical capacitance of the first capacitance element 61 is not less than 0.5 times and not more than 1.5 times the electrical capacitance of the first piezoelectric element 51. The electrical capacitance of the first capacitance element 61 may be not less than 0.8 times and not more than 1.2 times the electrical capacitance of the first piezoelectric element 51. For example, the magnitude of the current flowing in the first piezoelectric element 51 and the magnitude of the current flowing in the first capacitance element 61 are equal or close to each other. The frequency characteristics of the current flowing in the first piezoelectric element 51 can be more effectively fed back thereby.

According to the embodiment, there are cases where the circuit system oscillates when the gain is excessively high. According to the embodiment, the gain of the first circuit 21 (a first differential amplifier circuit) is not less than 10 and not more than 50. For example, the oscillation can be suppressed thereby. The gain of the first circuit 21 is, for example, the ratio of the resistance Rf21b to the resistance R21b.

In one example as shown in FIG. 2, the first transducer 51T includes the first piezoelectric element 51 and the first diaphragm 51F. The first piezoelectric element 51 and the first diaphragm 51F are stacked with each other. The first piezoelectric element 51 and the first diaphragm 51F that are stacked are supported by a supporter 51S.

The first piezoelectric element 51 includes the first electrode 51a, the second electrode 51b, and the first piezoelectric layer 51L provided between the first electrode 51a and the second electrode 51b. In the example, the second electrode 51b is between the first diaphragm 51F and the first electrode 51a. For example, the surface area of the first electrode 51a is less than the surface area of the second electrode 51b. The first piezoelectric layer 51L includes a polarization 51P.

The signal (the first drive signal Sv1) from the first circuit part 10D is applied between the first electrode 51a and the second electrode 51b. The first piezoelectric layer 51L is deformed by the signal (the alternating current signal). As a result, the first diaphragm 51F deforms and generates a sound wave 10W. For example, the first piezoelectric element 51 and the first diaphragm 51F that are stacked correspond to a bending vibrator.

Figure 5A:
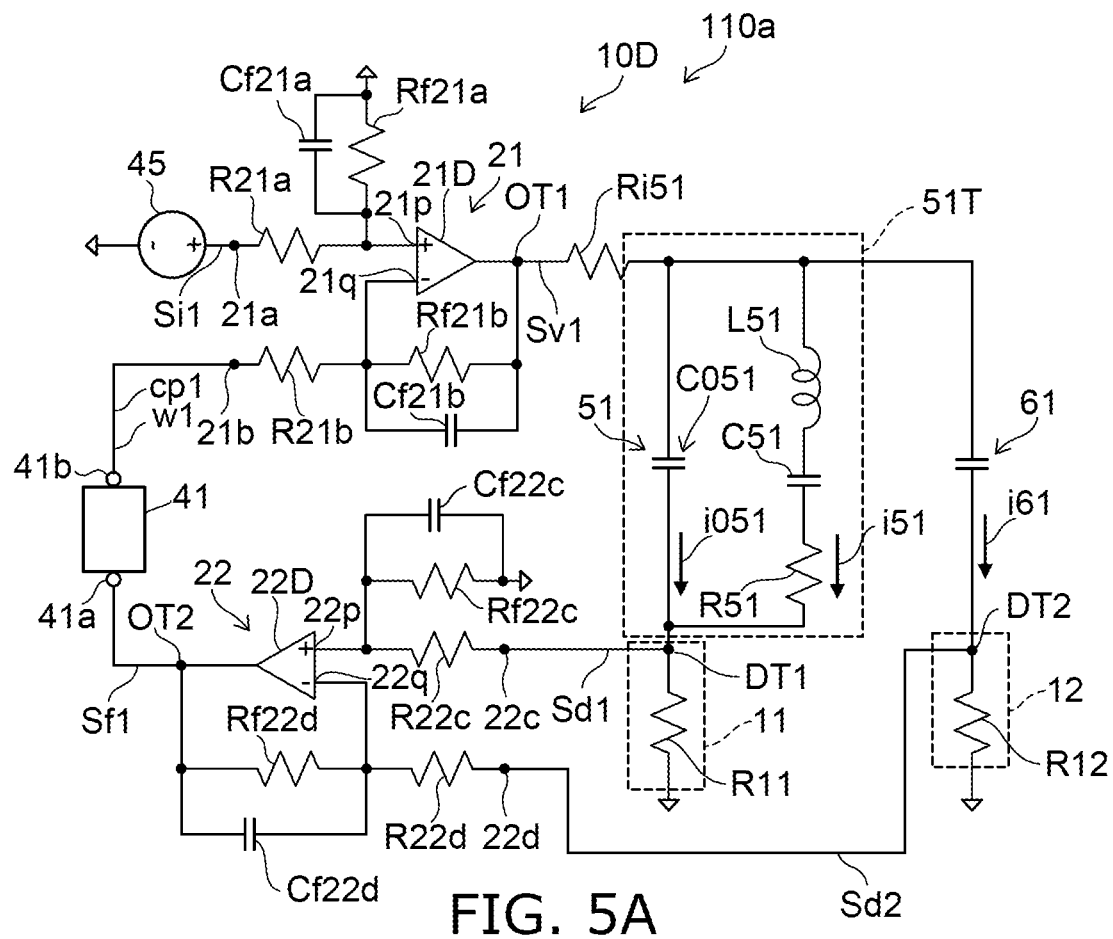
FIGS. 5A and 5B are circuit diagrams illustrating a drive circuit according to the first embodiment.
Figure 5B:
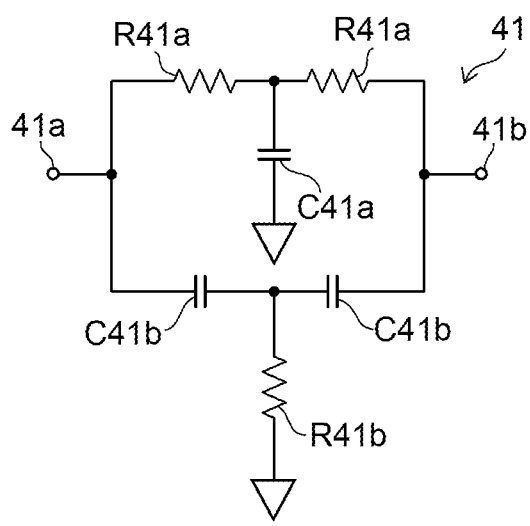

FIGS. 5A and 5B are circuit diagrams illustrating a drive circuit according to the first embodiment. In the drive circuit 110a according to the embodiment as shown in FIG. 5A, the first circuit part 10D includes a first filter 41. Otherwise, the configuration of the drive circuit 110a may be similar to the configuration of the drive circuit 110.

The first filter 41 is located in a current path cp1 (e.g., the wiring w1) between the second output terminal OT2 of the second circuit 22 and the second input terminal 21b of the first circuit 21. One end 41a of the first filter 41 is electrically connected with the second output terminal OT2. Another end 41b of the first filter 41 is electrically connected with the second input terminal 21b.

As described above, the second output terminal OT2 outputs the first differential signal Sf1 corresponding to the difference between the first detection signal Sd1 and the second detection signal Sd2. The first filter 41 filters the first differential signal Sf1.

As shown in FIG. 5B, for example, the first filter 41 may include a notch filter. In the notch filter of the example, a capacitor C41a is connected to the connection point between two resistances R41a connected in series. A resistance R41b is connected to the connection point between two capacitors C41b connected in series. The two resistances R41a that are connected in series and the two capacitors C41b that are connected in series are connected in parallel. The resistance of the resistance R41b is substantially ½ times the resistance of the resistance R41a. The electrical capacitance of the capacitor C41a is substantially 2 times the electrical capacitance of the capacitor C41b. The notch filter attenuates signals at the vicinity of the notch frequency to be extremely low. The notch frequency is $1/(2\pi RC)$, in which the resistance of the resistance R41a is R, and the electrical capacitance of the capacitor C41b is C.

Figure 6A:
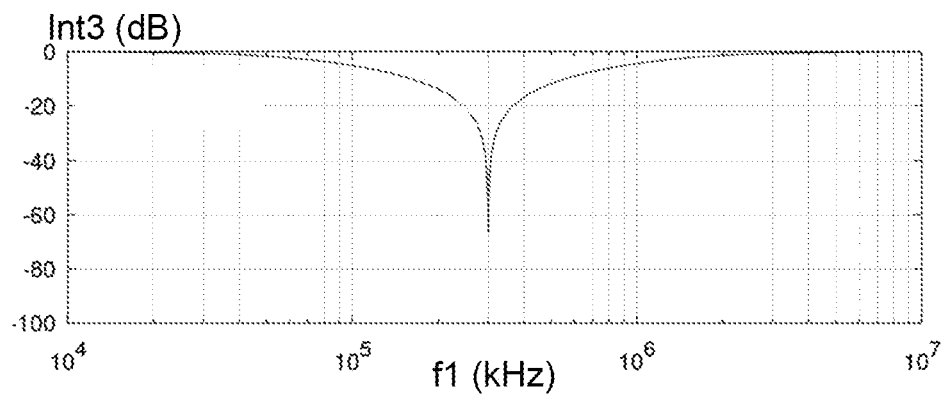
FIGS. 6A and 6B are graphs illustrating characteristics of a portion of the drive circuit according to the first embodiment.
Figure 6B:
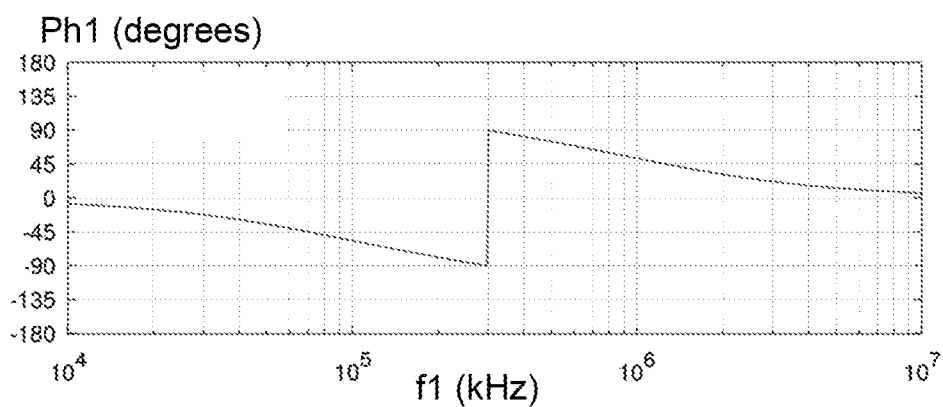

FIGS. 6A and 6B are graphs illustrating characteristics of a portion of the drive circuit according to the first embodiment.

These figures illustrate characteristics of the first filter 41. In the example, the first filter 41 has a notch filter configuration. In the example, the notch frequency is 300 kHz. In FIGS. 6A and 6B, the horizontal axis is the frequency f1. The vertical axis of FIG. 6A corresponds to a normalized intensity Int3 of the signal of the other end 41b of the first filter 41. The normalized intensity Int3 is the ratio of the intensity of the signal of the other end 41b of the first filter 41 to the intensity of the signal of the one end 41a of the first filter 41. The vertical axis of FIG. 6B corresponds to the phase Ph1 of the signal of the other end 41b of the first filter 41. As shown in FIG. 6A, the normalized intensity Int3 of the signal at the vicinity of about 300 kHz, i.e., the notch frequency, can be steeply reduced. For example, the oscillation of the circuit system described above is due to an unnecessary resonance of the transducer 51T other than the resonance utilized in the ultrasonic wave. By setting the notch frequency of the first filter 41 to substantially match the unnecessary resonance, the unnecessary resonance can be suppressed, and a high loop gain is applicable. For example, the pulse width of the ultrasonic wave generated by the first transducer 51T including the first piezoelectric element 51 can be effectively reduced thereby.

Figure 7:
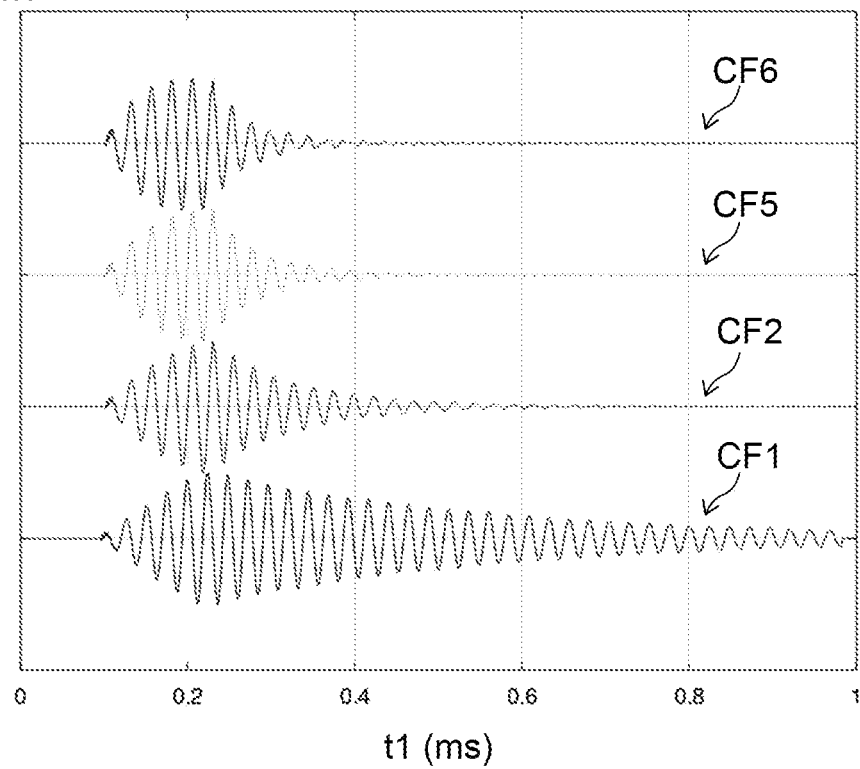
FIG. 7 is a graph illustrating characteristics of the drive circuit.

FIG. 7 is a graph illustrating characteristics of the drive circuit.

FIG. 7 illustrates simulation results of the first differential signal Sf1 when parameters of the drive circuit are changed. In FIG. 7, the input signal Si1 is a burst wave that includes five sine waves. The horizontal axis of FIG. 7 corresponds to the time t1. The vertical axis of FIG. 7 corresponds to the normalized intensity Int1 of the first differential signal Sf1. In the models of the simulation of FIG. 7, the resistance Ri51 is 100Ω, and the electrical capacitances of the capacitors Cf21$a$ and Cf21$b$ are 5 pF. Otherwise, the configurations of the models of the simulation of FIG. 7 are similar to the configurations described in reference to FIGS. 3A and 3B. In the models of the simulation of FIG. 7, the notch frequency of the first filter 41 is 300 kHz.

FIG. 7 illustrates characteristics of the Configurations CF1, CF2, CF5, and CF6. In the Configuration CF1, the first differential signal Sf1 is not supplied to the second input terminal 21$b$. In such a case, the second input terminal 21$b$ is grounded. In the Configuration CF2, the Configuration CF5, and the Configuration CF6, the first differential signal Sf1 is supplied to the second input terminal 21$b$. In the Configuration CF2, the resistances Rf21$a$ and Rf21$b$ are 100 kΩ. In the Configuration CF5, the resistances Rf21$a$ and Rf21$b$ are 220 kΩ. In the Configuration CF6, the resistances Rf21$a$ and Rf21$b$ are 330 kΩ.

For the Configuration CF1 as shown in FIG. 7, the time until the normalized intensity Int1 becomes small is extremely long. For the Configuration CF2, the Configuration CF5, and the Configuration CF6, the time until the normalized intensity Int1 becomes small is short. Thus, according to the embodiment, a short pulse length is obtained. A shorter pulse length is obtained by increasing the resistances Rf21$a$ and Rf21$b$. By using the first filter 41, a high loop gain can be applied, and the oscillation can be suppressed. For example, the pulse width of the sound wave (e.g., the ultrasonic wave) generated by the first transducer 51T including the first piezoelectric element 51 can be reduced.

Figure 8:
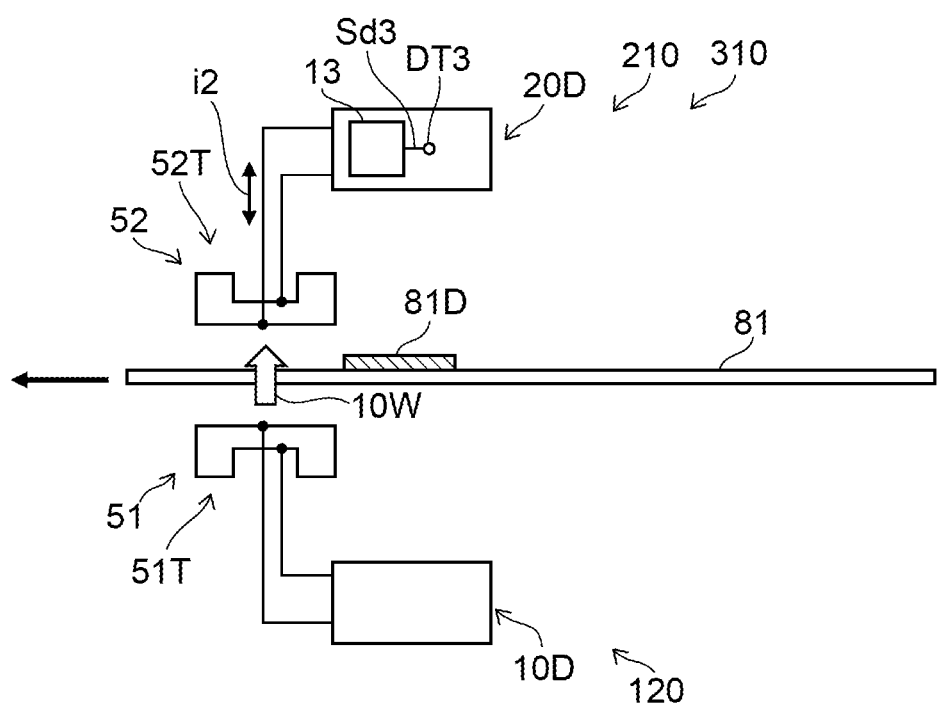
FIG. 8 is a schematic view illustrating an application of the drive circuit according to the first embodiment.

FIG. 8 is a schematic view illustrating an application of the drive circuit according to the first embodiment.

As shown in FIG. 8, the drive circuit 120 according to the embodiment further includes a second circuit part 20D in addition to the first circuit part 10D.

The drive circuit 120 is applicable to a transducer system 210. The transducer system 210 includes, for example, the first transducer 51T that includes the first piezoelectric element 51, a second transducer 52T that includes a second piezoelectric element 52, and the drive circuit 120. The sound wave 10W that is transmitted from the first transducer 51T is received by the second transducer 52T. The sound wave 10W includes, for example, the ultrasonic wave. The first transducer 51T is, for example, a transmitting device. The first circuit part 10D is, for example, a transmission drive circuit. The second transducer 52T is, for example, a receiver. The second circuit part 20D is, for example, a reception drive circuit. The first transducer 51T and the second transducer 52T are, for example, air-coupled ultrasonic transducers.

For example, an object 81 is provided between the first transducer 51T and the second transducer 52T. For example, the object 81 moves along a direction crossing the direction from the first transducer 51T toward the second transducer 52T. The object 81 is, for example, a banknote, etc. When foreign matter 81D or the like is adhered to the object 81, the state of the sound wave 10W received by the second transducer 52T is different from when the foreign matter 81D or the like is not adhered to the object 81. For example, the transducer system 210 is applicable to an inspection device 310.

The second circuit part 20D includes, for example, a third detecting part 13. The third detecting part 13 is configured to detect a second piezoelectric element current i2 flowing in the second piezoelectric element 52 (referring to FIG. 8) and to output a third detection signal Sd3 corresponding to the second piezoelectric element current i2. For example, the third detecting part 13 includes a third detection terminal DT3. The third detection terminal DT3 is configured to output the third detection signal Sd3 that corresponds to the second piezoelectric element current i2.

For example, the third detection signal Sd3 changes according to the state of the object 81 between the first transducer 51T and the second transducer 52T. The inspection device 310 is configured to inspect the object 81 based on the third detection signal Sd3.

An example of the second circuit part 20D will now be described.

Figure 9:
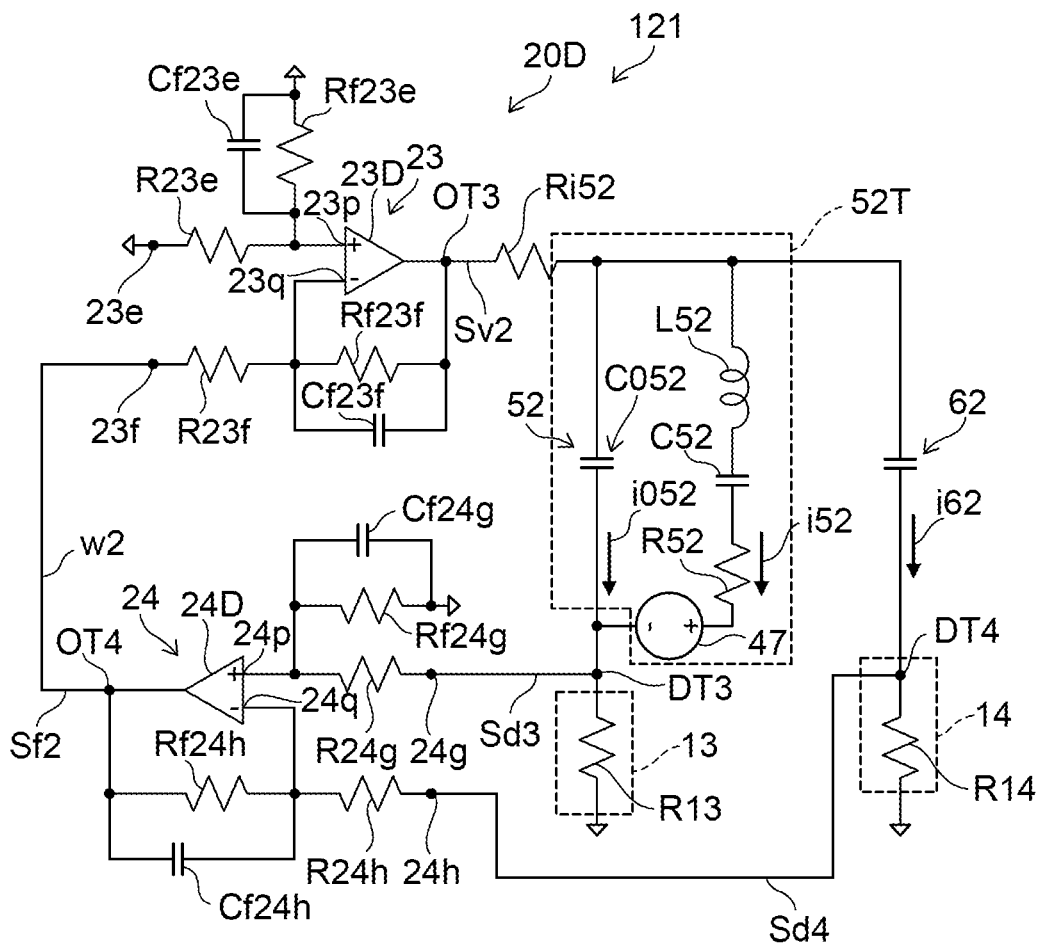
FIG. 9 is a circuit diagram illustrating the drive circuit according to the first embodiment.

FIG. 9 is a circuit diagram illustrating the drive circuit according to the first embodiment.

Figure 10:
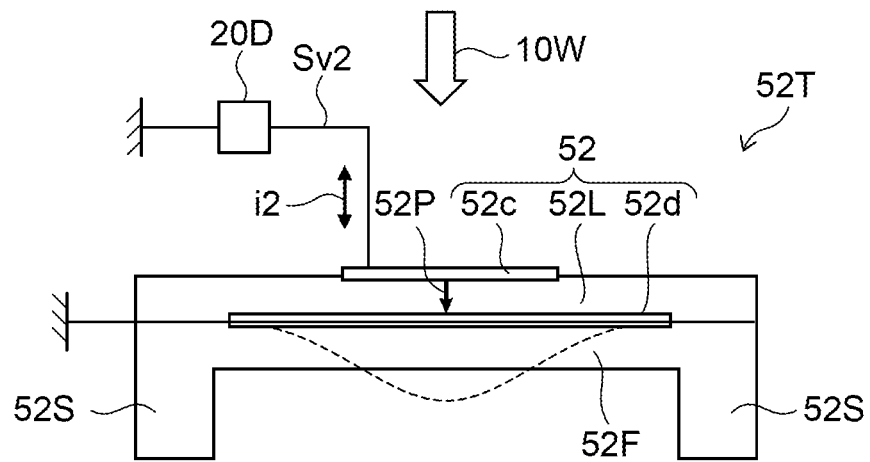
FIG. 10 is a schematic cross-sectional view illustrating a transducer used with the drive circuit according to the first embodiment.

FIG. 10 is a schematic cross-sectional view illustrating a transducer used with the drive circuit according to the first embodiment.

As shown in FIG. 9, the drive circuit 121 according to the embodiment includes the second circuit part 20D. The second circuit part 20D includes, for example, a third circuit 23 in addition to the third detecting part 13.

As described above, the third detecting part 13 is configured to detect the second piezoelectric element current i2 flowing in the second piezoelectric element 52 (referring to FIG. 8) and to output the third detection signal Sd3 corresponding to the second piezoelectric element current i2.

As shown in FIG. 10, for example, the second piezoelectric element 52 includes a third electrode 52$c$, a fourth electrode 52$d$, and a second piezoelectric layer 52L provided between the third electrode 52$c$ and the fourth electrode 52$d$. For example, the second circuit part 20D is used with the second transducer 52T including the second piezoelectric element 52.

As shown in FIG. 9, the third circuit 23 is configured to apply a second drive signal Sv2 to the second piezoelectric element 52. For example, the third circuit 23 includes a third output terminal OT3. The third output terminal OT3 outputs the second drive signal Sv2. The third output terminal OT3 is electrically connected with the second piezoelectric element 52.

A second capacitance element 62 is provided in the example. The second capacitance element 62 is electrically connected with the second piezoelectric element 52. The second capacitance element 62 may be included in the second circuit part 20D. The second capacitance element 62 may be provided separately from the second circuit part 20D. The second capacitance element 62 may be included in the second transducer 52T. The second capacitance element 62 may be provided separately from the second circuit part 20D and the second transducer 52T.

For example, the second capacitance element 62 is electrically connected in parallel with the second piezoelectric element 52. For example, the electrical capacitance of the second capacitance element 62 is not less than 0.5 times and not more than 1.5 times the electrical capacitance of the second piezoelectric element 52. The electrical capacitance of the second capacitance element 62 may be not less than 0.8 times and not more than 1.2 times the electrical capacitance of the second piezoelectric element 52.

The third circuit 23 is configured to apply the second drive signal Sv2 to the second piezoelectric element 52 and the second capacitance element 62. The second drive signal Sv2 is applied to the second piezoelectric element 52 and the second capacitance element 62.

The third circuit 23 may further include a fifth input terminal 23e and a sixth input terminal 23f. For example, the potential of the fifth input terminal 23e is fixed. The second drive signal Sv2 corresponds to the potential difference between the fifth input terminal 23e and the sixth input terminal 23f.

In the example, the second circuit part 20D further includes a fourth detecting part 14 and a fourth circuit 24. The fourth detecting part 14 is configured to output a fourth detection signal Sd4 that corresponds to the second capacitance element current i2 flowing in the second capacitance element 62 (referring to FIG. 8). For example, the fourth detecting part 14 includes a fourth detection terminal DT4. The fourth detection terminal DT4 is configured to output the fourth detection signal Sd4.

The fourth circuit 24 includes a seventh input terminal 24g and an eighth input terminal 24h. The third detection signal Sd3 is input to the seventh input terminal 24g. The fourth detection signal Sd4 is input to the eighth input terminal 24h. The fourth circuit 24 is configured to supply, to the sixth input terminal 23f, a second differential signal Sf2 that corresponds to the difference between the third detection signal Sd3 and the fourth detection signal Sd4.

In the example, the second differential signal Sf2 that corresponds to the difference between the third detection signal Sd3 and the fourth detection signal Sd4 is fed back to the third circuit 23. Thereby, for example, the second transducer 52T that includes the second piezoelectric element 52 can respond to a sound wave (e.g., including an ultrasonic wave) that has a short pulse length. For example, the second transducer 52T can respond to a wide-bandwidth sound wave (e.g., including an ultrasonic wave).

In the example, the second transducer 52T includes the second piezoelectric element 52 and a second diaphragm 52F (referring to FIG. 10). The second piezoelectric element 52 is fixed to the second diaphragm 52F. For example, the second piezoelectric element 52 is stacked with the second diaphragm 52F. For example, the second piezoelectric element 52 and the second diaphragm 52F that are stacked vibrate as a continuous body.

The second transducer 52T can be electrically represented by an equivalent circuit that includes a capacitor C052 and an LCR circuit electrically connected in parallel with the capacitor C052. The LCR circuit includes an inductor L52, a capacitor C52, and a resistance R52 that are connected to each other in series. The capacitor C052 corresponds to the electrostatic capacitance between two electrodes of the second piezoelectric element 52. The inductor L52 corresponds to a mass that is a mechanical quantity of the second transducer 52T. The capacitor C52 corresponds to the reciprocal of a spring constant that is a mechanical quantity of the second transducer 52T. The resistance R52 corresponds to an attenuation constant that is a mechanical quantity of the second transducer 52T. The conversion from these mechanical quantities to electrical quantities is based on, for example, a piezoelectric effect of the second piezoelectric element 52.

As shown in FIG. 9, a signal source 47 is provided in the equivalent circuit of the second transducer 52T. The signal source 47 is electrically connected in series with the inductor L52, the capacitor C52, and the resistance R52. For example, the second diaphragm 52F and the second piezoelectric element 52 are deformed by a sound wave (e.g., an ultrasonic wave) received by the second transducer 52T. A voltage that corresponds to the deformation is generated in the second piezoelectric element 52. The voltage corresponds to the signal source 47.

For example, a current i52 flows in the LCR circuit. A current i052 flows in the capacitor C052. The second piezoelectric element current i2 (referring to FIG. 10) corresponds to the sum of the current i52 and the current i052. The second detection signal Sd2 corresponds to the sum of the current i52 and the current i052.

For example, a signal that is generated by the sound wave (e.g., the ultrasonic wave) received by the second transducer 52T flows in the second piezoelectric element 52. The sound wave that is received can be received (detected) by detecting the second piezoelectric element current i2 flowing through the second piezoelectric element 52.

In the example, the third detecting part 13 includes a resistance R13. For example, one end of the resistance R13 is electrically connected with one end of the second piezoelectric element 52. The other end of the resistance R13 is set to a fixed potential (e.g., the ground potential). The one end of the resistance R13 corresponds to the third detection terminal DT3.

In the example, the fourth detecting part 14 includes a resistance R14. For example, one end of the resistance R14 is electrically connected with one end of the second capacitance element 62. The other end of the resistance R14 is set to a fixed potential (e.g., the ground potential). The one end of the resistance R14 corresponds to the fourth detection terminal DT4.

The third output terminal OT3 of the third circuit 23 is electrically connected with the other end of the second piezoelectric element 52 and the other end of the second capacitance element 62. A resistance Ri52 may be provided between the third output terminal OT3 and the other end of the second piezoelectric element 52.

In the third circuit 23 of the example, the fifth input terminal 23e is a positive input terminal; and the sixth input terminal 23f is a negative input terminal. In the example, the third circuit 23 includes a differential amplifier 23D, a resistance R23e, a resistance R23f, a resistance Rf23e, a capacitor Cf23e, a resistance Rf23f, and a capacitor Cf23f. The resistance R23e is located in a current path between the fifth input terminal 23e and an input part 23p of the differential amplifier 23D. The resistance R23f is located in a current path between the sixth input terminal 23f and an input part 23q of the differential amplifier 23D. The capacitor Cf23e is electrically connected in parallel with the resistance Rf23e. One end of the capacitor Cf23e and one end of the resistance Rf23e are electrically connected with the input part 23p of the differential amplifier 23D. The other ends of the capacitor Cf23e and the resistance Rf23e are electrically connected to a fixed potential (e.g., the ground potential). The capacitor Cf23f is electrically connected in parallel with the resistance Rf23f. One end of the capacitor Cf23f and one end of the resistance Rf23f are electrically connected with the input part 23q of the differential amplifier 23D. The other ends of the capacitor Cf23f and the resistance Rf23f are electrically connected with an outputter (the third output terminal OT3) of the differential amplifier 23D. The resistances are selected to obtain the appropriate amplification factor. For example, a positive power supply and a negative power supply are supplied to the differential amplifier 23D.

In the fourth circuit 24 of the example, the seventh input terminal 24g is a positive input terminal; and the eighth input terminal 24h is a negative input terminal. In the example, the fourth circuit 24 includes a differential amplifier 24D, a resistance R24g, a resistance R24h, a resistance Rf24g, a capacitor Cf24g, a resistance Rf24h, and a capacitor Cf24h. The resistance R24g is located in a current path between the seventh input terminal 24g and an input part 24p of the differential amplifier 24D. The resistance R24h is located in a current path between the eighth input terminal 24h and an input part 24q of the differential amplifier 24D. The capacitor Cf24g is electrically connected in parallel with the resistance Rf24g. One end of the capacitor Cf24g and one end of the resistance Rf24g are electrically connected with the input part 24p of the differential amplifier 24D. The other ends of the capacitor Cf24g and the resistance Rf24g are electrically connected to a fixed potential (e.g., the ground potential). The capacitor Cf24h is electrically connected in parallel with the resistance Rf24h. One end of the capacitor Cf24h and one end of the resistance Rf24h are electrically connected with the input part 24q of the differential amplifier 24D. The other ends of the capacitor Cf24h and the resistance Rf24h are electrically connected with an outputter (a fourth output terminal OT4) of the differential amplifier 24D. The resistances are selected to obtain the appropriate amplification factor. For example, a positive power supply and a negative power supply are supplied to the differential amplifier 24D.

The fourth output terminal OT4 and the sixth input terminal 23f may be electrically connected by wiring w2, etc. A filter may be provided in a current path (e.g., the wiring w2) between the fourth output terminal OT4 and the sixth input terminal 23f. The filter may have a configuration similar to that of the first filter 41.

Figure 11:
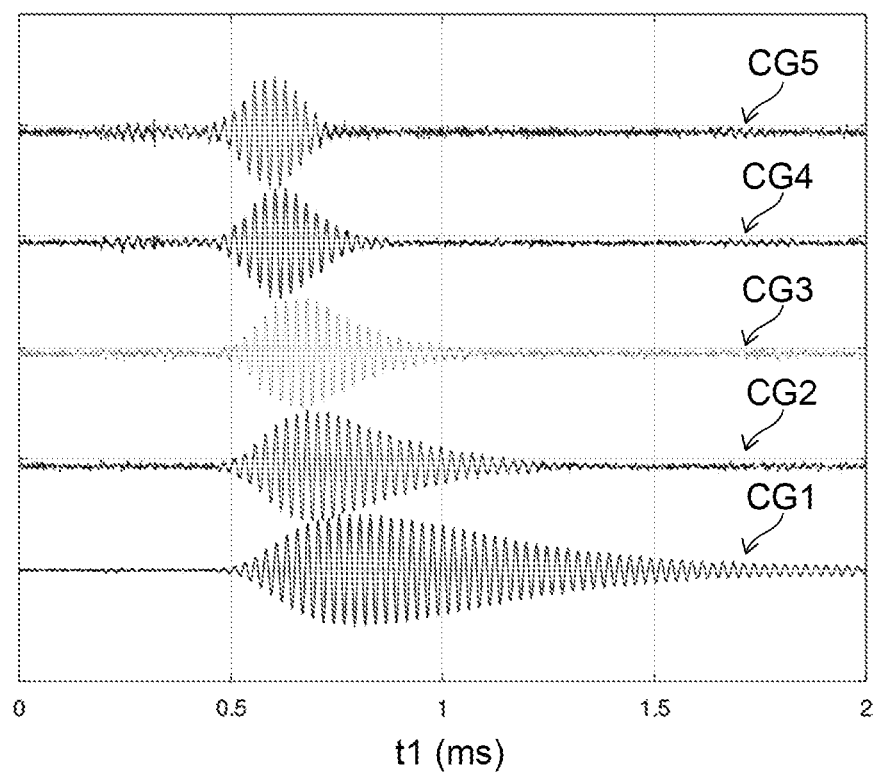
FIG. 11 is a graph illustrating characteristics of the drive circuit.

FIG. 11 is a graph illustrating characteristics of the drive circuit.

FIG. 11 illustrates measurement results of signals obtained when the first circuit part 10D and the second circuit part 20D were used. A voltage was applied to the first piezoelectric element 51 by the first circuit part 10D; and the sound wave low (the ultrasonic wave) was emitted from the first transducer 51T. The sound wave 10W was received by the second transducer 52T. The horizontal axis of FIG. 11 corresponds to the time t1. The vertical axis of FIG. 11 corresponds to the normalized intensity Int1 of the second differential signal Sf2.

In the measurement samples, the first circuit part 10D had the configuration described in reference to FIGS. 3A and 3B. In the measurement samples, the electrical capacitance (the capacitor CO52) of the second piezoelectric element 52 was 1.76 nF, the inductor L52 was 48.1 mH, the electrical capacitance of the capacitor C52 was 0.319 nF, and the resistance R52 was 274Ω. The electrical capacitance of the second capacitance element 62 was 2 nF. The resistance R13 was 10Ω. The resistance R14 was 10Ω. The resistance Ri51 was 100 C2. The resistances R23e, R23f, R24g, and R24h were 10 kΩ. The resistances Rf24h and Rf24g were 100 kΩ. The electrical capacitances of the capacitors Cf23e and Cf23f were 1 pF. The electrical capacitances of the capacitors Cf24g and Cf24h were 0 pF.

FIG. 11 illustrates characteristics of Configurations CG1 to CG5. In the Configuration CG1, the second differential signal Sf2 was not supplied to the sixth input terminal 23f. In such a case, the sixth input terminal 23f was included. In the Configurations CG2 to CG5, the second differential signal Sf2 was supplied to the sixth input terminal 23f. In the Configuration CG2, the resistances Rf23f and Rf23e were 56 kΩ. In the Configuration CG3, the resistances Rf23f and Rf23e were 100 kΩ. In the Configuration CG4, the resistances Rf23f and Rf23e were 220 kΩ. In the Configuration CG5, the resistances Rf23f and Rf23e were 330 kΩ.

For the Configuration CG1 as shown in FIG. 11, the time until the normalized intensity Int1 became small was extremely long. For the Configurations CG2 to CG5, the time until the normalized intensity Int1 became small was short. Thus, according to the embodiment, a short pulse length is obtained. A shorter pulse length is obtained by increasing the resistances Rf23f and Rf23e.

For example, the vibration of the second transducer 52T due to the sound wave received by the second transducer 52T can be quickly attenuated. For example, a sound wave that has a short pulse width can be stably received.

In an air-coupled ultrasonic transducer, the diaphragm includes a piezoelectric element and an elastic body (the first diaphragm 51F, the second diaphragm 52F, etc.). The sound wave 10W (including an ultrasonic wave) is generated by vibrating the diaphragm.

The motion equation of the diaphragm is given by the following first formula.

$$m\frac{dv}{dt} + cv + k\int v\,dt = \eta V \tag{1}$$

In the first formula, "v" is the vibration velocity. "m" is the mass of the diaphragm. "c" is the attenuation coefficient of the diaphragm. "k" is the spring constant of the diaphragm. "η" is a coefficient based on the piezoelectric effect that converts the voltage into a force. "V" is the applied voltage.

For example, a force that is proportional to the vibration velocity v is applied using the piezoelectric effect. The proportionality constant of the force is taken as "c'". The following second formula is obtained.

$$m\frac{dv}{dt} + cv + k\int v\,dt = \eta V - c'v \tag{2}$$

The following third formula is obtained from the second formula.

$$m\frac{dv}{dt} + (c+c')v + k\int v\,dt = \eta V \tag{3}$$

Comparing the first and third formulas, it can be seen that the attenuation coefficient of the third formula increases from "c" to "c+c'"; and the damping of the vibration of the diaphragm is increased.

On the other hand, the sound pressure p is given by za×v, in which the specific acoustic impedance of air is za. Accordingly, the sound pressure pulse can be shortened by damping the vibration of the diaphragm by increasing the attenuation. Pulse-shortening is possible by a method in which the velocity is fed back. This method also can be considered to be a control system that feeds back the velocity.

When applying this method, the velocity of the diaphragm may be detected, and the velocity that is detected may be fed back. The device becomes large if a detecting part (e.g., electrodes, etc.) is provided to detect the velocity of the diaphragm.

According to the embodiment, the vibration of the diaphragm can be damped without providing a detecting part for detecting the velocity of the diaphragm.

According to the embodiment, the pulse length can be short in a wide bandwidth without using a detecting part, etc. According to the embodiment, the operating characteristics of the transducer can be improved without making the transducer complex.

In the equivalent circuit of the transducer, an electrical capacitance C0 of the piezoelectric element and an LCR circuit that is connected in series are electrically connected in parallel. For example, the electrical capacitance C0 corresponds to a damper capacitance. The electrical capacitance C0 is an electrical electrostatic capacitance. On the other hand, the inductor, the electrical capacitance, and the resistance that are included in the LCR circuit correspond to the mechanical quantities of m, k, and c of the diaphragm that are converted into electrical quantities by the piezoelectric effect. For example, the current that flows through the electrical capacitance C0 is taken as I0; and the current that flows in the LCR circuit is taken as Iv. The current Iv proportional to the vibration velocity v of the diaphragm.

For example, the electrical capacitance of the first capacitance element 61 in the example shown in FIG. 1 is set to be equal to the electrical capacitance C0 of the first piezoelectric element 51. The current that flows in the first capacitance element 61 is taken as Iref. In such a case, the first differential signal Sf1 is (I0−Iv)−Iref, i.e., Iv. The first differential signal Sf1 that is the output of the second circuit 22 is a voltage that is proportional to the velocity v. According to the embodiment, the first circuit 21 and the second circuit 22 illustrated in FIG. 1 are included in the velocity feedback system of the diaphragm. By using such a drive circuit, the vibration of the diaphragm can be damped without making the transducer more complex.

The signal source 47 is included in the example shown in FIG. 9. The signal source 47 corresponds to the sound pressure that is applied to the diaphragm (the second transducer 52T) and converted into an electrical quantity. Due to the signal source 47, a current that is proportional to the vibration velocity of the diaphragm flows; and a voltage (the third detection signal Sd3) that corresponds to the current is fed back to the sixth input terminal 23f of the third circuit 23 via the fourth circuit 24. On the other hand, the potential of the fifth input terminal 23e of the third circuit 23 is fixed (e.g., set to 0 V); therefore, the entire circuit operates to cause the vibration velocity of the diaphragm to approach 0. Therefore, the vibration of the diaphragm that receives the sound wave is quickly attenuated, and pulse-shortening of the received signal is performed. In the second circuit part 20D, the received signal (the second differential signal Sf2) is proportional to the vibration velocity of the diaphragm.

In the second circuit part 20D, the potential of the fifth input terminal 23e of the third circuit 23 is fixed (e.g., set to 0 V); otherwise, the configuration of the second circuit part 20D may be similar to the configuration of the first circuit part 10D.

The configuration described in reference to FIG. 9 is applicable to the embodiment. In such a case, the second circuit part 20D may be considered to be the "first circuit part". For example, as shown in FIG. 9, the drive circuit (the drive circuit 121) according to the embodiment includes the first circuit part (the second circuit part 20D illustrated in FIG. 9). The first circuit part (the second circuit part 20D illustrated in FIG. 9) includes the first detecting part (the third detecting part 13 illustrated in FIG. 9), the second detecting part (the fourth detecting part 14 illustrated in FIG. 9), the first circuit (the third circuit 23 illustrated in FIG. 9), and the second circuit (the fourth circuit part 24 illustrated in FIG. 9). These detecting parts and circuits may have the configurations of FIG. 9. For example, a drive circuit can be provided in the receiver in which operating characteristics can be improved.

As shown in FIG. 10, for example, the second transducer 52T includes the second piezoelectric element 52 and the second diaphragm 52F. The second piezoelectric element 52 and the second diaphragm 52F are stacked with each other. The second piezoelectric element 52 and the second diaphragm 52F that are stacked are supported by a supporter 52S.

The second piezoelectric element 52 includes the third electrode 52c, the fourth electrode 52d, and the second piezoelectric layer 52L provided between the third electrode 52c and the fourth electrode 52d. In the example, the fourth electrode 52d is between the second diaphragm 52F and the third electrode 52c. For example, the surface area of the third electrode 52c is less than the surface area of the fourth electrode 52d. The second piezoelectric layer 52L includes a polarization 52P.

The second circuit part 20D is electrically connected with the third and fourth electrodes 52c and 52d. For example, the second diaphragm 52F is deformed by the sound wave 10W; and a signal that corresponds to the sound wave 10W is generated in the second piezoelectric element 52. The second circuit part 20D is configured to detect this signal. For example, the second piezoelectric element 52 and the second diaphragm 52F that are stacked correspond to a bending vibrator. For example, the second drive signal Sv2 from the second circuit part 20D may be applied between the third electrode 52c and the fourth electrode 52d. For example, the vibration of the second diaphragm 52F is damped.

The bandwidth of such a bending vibrator is narrow. The bandwidth of the drive circuit according to the embodiment can be widened.

Second Embodiment

A second embodiment relates to a transducer system. The transducer system 210 according to the embodiment (referring to FIG. 8) includes the drive circuit according to the first embodiment, the first transducer 51T that includes the first piezoelectric element 51, and the second transducer 52T that includes the second piezoelectric element 52. The second transducer 52T receives the sound wave 10W transmitted from the first transducer 51T. The third detection signal Sd3 changes according to the state of the object 81 between the first transducer 51T and the second transducer 52T.

Third Embodiment

A third embodiment relates to an inspection device. The inspection device 310 according to the embodiment (referring to FIG. 8) includes the transducer system 210 according to the second embodiment. The inspection device 310 inspects the object 81 based on the third detection signal Sd3.

For example, by setting the repetition frequency of the transmission and reception of the sound wave 10W to be high, the inspection is possible even when the foreign matter 81D (referring to FIG. 8) is small and the movement speed of the object 81 is fast. It can be seen from the result shown in FIG. 11 that according to the embodiment, pulse-shortening can be performed by increasing the loop gain; thereby, a high-resolution and fast inspection is possible.

According to the embodiment, for example, the pulse length can be reduced without making the configuration of the transducer more complex. For example, the bandwidth can be widened. For example, a high drive efficiency is obtained.

For example, because the pulse length of the transmission and reception is short, the repetition frequency of the pulse can be increased, and fast information collection is possible. Because the pulse length is short, the effects of multiple reflections between the transducers for transmitting and receiving can be reduced.

Embodiments may include the following configurations (e.g., technological proposals).

Configuration 1

A drive circuit comprising:
a first circuit part,
the first circuit part including
a first detecting part configured to:
  detect a first piezoelectric element current flowing in a first piezoelectric element; and
  output a first detection signal corresponding to the first piezoelectric element current,
a second detecting part configured to:
  detect a first capacitance element current flowing in a first capacitance element electrically connected with the first piezoelectric element; and
  output a second detection signal corresponding to the first capacitance element current,
a first circuit including a first input terminal and a second input terminal, an input signal being input to the first input terminal, the first circuit being configured to apply a first drive signal to the first piezoelectric element and the first capacitance element, the first drive signal corresponding to a potential difference between the first input terminal and the second input terminal, and
a second circuit including a third input terminal and a fourth input terminal, the first detection signal being input to the third input terminal, the second detection signal being input to the fourth input terminal, the second circuit being configured to supply a first differential signal to the second input terminal, the first differential signal corresponding to a difference between the first detection signal and the second detection signal.

Configuration 2

The drive circuit according to Configuration 1, wherein the first capacitance element is electrically connected in parallel with the first piezoelectric element.

Configuration 3

The drive circuit according to Configuration 1 or 2, wherein
an electrical capacitance of the first capacitance element is not less than 0.5 times and not more than 1.5 times an electrical capacitance of the first piezoelectric element.

Configuration 4

The drive circuit according to Configuration 1 or 2, wherein
an electrical capacitance of the first capacitance element is not less than 0.8 times and not more than 1.2 times an electrical capacitance of the first piezoelectric element.

Configuration 5

The drive circuit according to any one of Configurations 1 to 4, wherein
the first circuit is configured to drive the first piezoelectric element and the first capacitance element according to the input signal.

Configuration 6

The drive circuit according to any one of Configurations 1 to 5, wherein
the first circuit part further includes a first filter,
the second circuit further includes a second output terminal,
the second output terminal is configured to output the first differential signal corresponding to the difference between the first detection signal and the second detection signal, and
the first filter is located in a current path between the second output terminal and the second input terminal.

Configuration 7

The drive circuit according to Configuration 6, wherein the first filter includes a notch filter.

Configuration 8

The drive circuit according to any one of Configurations 1 to 7, further comprising:
a second circuit part,
the second circuit part including a third detecting part,
the third detecting part being configured to detect a second piezoelectric element current flowing in a second piezoelectric element,
the third detecting part being configured to output a third detection signal corresponding to the second piezoelectric element current.

Configuration 9

The drive circuit according to Configuration 8, wherein
the second circuit part further includes a third circuit, and
the third circuit is configured to apply a second drive signal to the second piezoelectric element.

Configuration 10

The drive circuit according to Configuration 9, wherein
the third circuit also is configured to apply the second drive signal to a second capacitance element electrically connected with the second piezoelectric element.

Configuration 11

The drive circuit according to Configuration 10, wherein
the second capacitance element is electrically connected in parallel with the second piezoelectric element.

Configuration 12

The drive circuit according to Configuration 10 or 11, wherein
an electrical capacitance of the second capacitance element is not less than 0.5 times and not more than 1.5 times an electrical capacitance of the second piezoelectric element.

Configuration 13

The drive circuit according to Configuration 10 or 11, wherein
an electrical capacitance of the second capacitance element is not less than 0.8 times and not more than 1.2 times an electrical capacitance of the second piezoelectric element.

Configuration 14

The drive circuit according to any one of Configurations 10 to 13, wherein
the third circuit further includes a fifth input terminal and a sixth input terminal,
a potential of the fifth input terminal is fixed,
the second drive signal corresponds to a potential difference between the fifth input terminal and the sixth input terminal,
the second circuit part further includes a fourth detecting part and a fourth circuit,
the fourth detecting part is configured to output a fourth detection signal corresponding to a second capacitance element current flowing in the second capacitance element, the fourth circuit includes a seventh input terminal and an eighth input terminal, the third detection signal is input to the seventh input terminal, the fourth detection signal is input to the eighth input terminal, and the fourth circuit is configured to supply, to the sixth input terminal, a second differential signal corresponding to a difference between the third detection signal and the fourth detection signal.

Configuration 15

A drive circuit, comprising:

a first circuit part, the first circuit part including a first detecting part configured to:
  detect a first piezoelectric element current flowing in a first piezoelectric element; and
  output a first detection signal corresponding to the first piezoelectric element current, a second detecting part configured to:
  detect a first capacitance element current flowing in a first capacitance element electrically connected with the first piezoelectric element; and
  output a second detection signal corresponding to the first capacitance element current, a first circuit including a first input terminal and a second input terminal, a potential of the first input terminal being fixed, the first circuit being configured to apply, to the first piezoelectric element and the first capacitance element, a first drive signal corresponding to a potential difference between the first input terminal and the second input terminal, and a second circuit including a third input terminal and a fourth input terminal, the first detection signal being input to the third input terminal, the second detection signal being input to the fourth input terminal, the second circuit being configured to supply, to the second input terminal, a first differential signal corresponding to a difference between the first detection signal and the second detection signal.

Configuration 16

A transducer system, comprising:

the drive circuit according to any one of Configurations 8 to 14;

a first transducer including the first piezoelectric element; and a second transducer including the second piezoelectric element, the second transducer receiving a sound wave transmitted from the first transducer, the third detection signal changing according to a state of an object between the first transducer and the second transducer.

Configuration 17

An inspection device, comprising:

the transducer system according to Configuration 16, the inspection device inspecting the object based on the third detection signal.

According to embodiments, a drive circuit, a transducer system, and an inspection device can be provided in which operating characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in drive circuits such as detecting parts, circuits, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all derive circuits, transducer systems, and inspection devices practicable by an appropriate design modification by one skilled in the art based on the drive circuits, the transducer systems, and the inspection devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A drive circuit comprising:

a first circuit part, the first circuit part including a first detecting part configured to:
  detect a first piezoelectric element current flowing in a first piezoelectric element; and
  output a first detection signal corresponding to the first piezoelectric element current, a second detecting part configured to:
  detect a first capacitance element current flowing in a first capacitance element electrically connected with the first piezoelectric element; and
  output a second detection signal corresponding to the first capacitance element current, a first circuit including a first input terminal and a second input terminal, an input signal being input to the first input terminal, the first circuit being configured to apply a first drive signal to the first piezoelectric element and the first capacitance element, the first drive signal corresponding to a potential difference between the first input terminal and the second input terminal, and a second circuit including a third input terminal and a fourth input terminal, the first detection signal being input to the third input terminal, the second detection signal being input to the fourth input terminal, the second circuit being configured to supply a first differential signal to the second input terminal, the first differential signal corresponding to a difference between the first detection signal and the second detection signal.

2. The drive circuit according to claim 1, wherein the first capacitance element is electrically connected in parallel with the first piezoelectric element.

3. The drive circuit according to claim 1, wherein
an electrical capacitance of the first capacitance element is not less than 0.5 times and not more than 1.5 times an electrical capacitance of the first piezoelectric element.

4. The drive circuit according to claim 1, wherein
an electrical capacitance of the first capacitance element is not less than 0.8 times and not more than 1.2 times an electrical capacitance of the first piezoelectric element.

5. The drive circuit according to claim 1, wherein
the first circuit is configured to drive the first piezoelectric element and the first capacitance element according to the input signal.

6. The drive circuit according to claim 1, wherein
the first circuit part further includes a first filter,
the second circuit further includes a second output terminal,
the second output terminal is configured to output the first differential signal corresponding to the difference between the first detection signal and the second detection signal, and
the first filter is located in a current path between the second output terminal and the second input terminal.

7. The drive circuit according to claim 6, wherein
the first filter includes a notch filter.

8. The drive circuit according to claim 1, further comprising:
a second circuit part,
the second circuit part including a third detecting part,
the third detecting part being configured to detect a second piezoelectric element current flowing in a second piezoelectric element,
the third detecting part being configured to output a third detection signal corresponding to the second piezoelectric element current.

9. The drive circuit according to claim 8, wherein
the second circuit part further includes a third circuit, and
the third circuit is configured to apply a second drive signal to the second piezoelectric element.

10. The drive circuit according to claim 9, wherein
the third circuit also is configured to apply the second drive signal to a second capacitance element electrically connected with the second piezoelectric element.

11. The drive circuit according to claim 10, wherein
the second capacitance element is electrically connected in parallel with the second piezoelectric element.

12. The drive circuit according to claim 10, wherein
an electrical capacitance of the second capacitance element is not less than 0.5 times and not more than 1.5 times an electrical capacitance of the second piezoelectric element.

13. The drive circuit according to claim 10, wherein
an electrical capacitance of the second capacitance element is not less than 0.8 times and not more than 1.2 times an electrical capacitance of the second piezoelectric element.

14. The drive circuit according to claim 10, wherein
the third circuit further includes a fifth input terminal and a sixth input terminal,
a potential of the fifth input terminal is fixed,
the second drive signal corresponds to a potential difference between the fifth input terminal and the sixth input terminal, the second circuit part further includes a fourth detecting part and a fourth circuit,
the fourth detecting part is configured to output a fourth detection signal corresponding to a second capacitance element current flowing in the second capacitance element,
the fourth circuit includes a seventh input terminal and an eighth input terminal,
the third detection signal is input to the seventh input terminal,
the fourth detection signal is input to the eighth input terminal, and
the fourth circuit is configured to supply, to the sixth input terminal, a second differential signal corresponding to a difference between the third detection signal and the fourth detection signal.

15. A transducer system, comprising:
the drive circuit according to claim 8;
a first transducer including the first piezoelectric element; and
a second transducer including the second piezoelectric element,
the second transducer receiving a sound wave transmitted from the first transducer,
the third detection signal changing according to a state of an object between the first transducer and the second transducer.

16. An inspection device, comprising:
the transducer system according to claim 15,
the inspection device inspecting the object based on the third detection signal.

17. A drive circuit, comprising:
a first circuit part,
the first circuit part including
a first detecting part configured to:
detect a first piezoelectric element current flowing in a first piezoelectric element; and
output a first detection signal corresponding to the first piezoelectric element current,
a second detecting part configured to:
detect a first capacitance element current flowing in a first capacitance element electrically connected with the first piezoelectric element; and
output a second detection signal corresponding to the first capacitance element current,
a first circuit including a first input terminal and a second input terminal, a potential of the first input terminal being fixed, the first circuit being configured to apply, to the first piezoelectric element and the first capacitance element, a first drive signal corresponding to a potential difference between the first input terminal and the second input terminal, and
a second circuit including a third input terminal and a fourth input terminal, the first detection signal being input to the third input terminal, the second detection signal being input to the fourth input terminal, the second circuit being configured to supply, to the second input terminal, a first differential signal corresponding to a difference between the first detection signal and the second detection signal.

* * * * *